United States Patent [19]
Takase

[11] Patent Number: 5,825,221
[45] Date of Patent: Oct. 20, 1998

[54] OUTPUT CIRCUIT OF SEMICONDUCTOR DEVICE

[75] Inventor: Hiroshi Takase, Kasugai, Japan

[73] Assignee: Fujitsu Limited, Kanagawa, Japan

[21] Appl. No.: 788,697

[22] Filed: Jan. 24, 1997

[30] Foreign Application Priority Data

Jan. 29, 1996 [JP] Japan ................................. 8-013222

[51] Int. Cl.[6] ........................................... H03K 19/0175
[52] U.S. Cl. .................... 327/143; 327/108; 327/538; 327/541; 327/55; 365/226
[58] Field of Search ................................ 327/108, 365, 327/376, 442, 427, 437, 112, 143, 530, 545, 546, 538, 541, 55; 326/56, 58, 82, 86, 87; 365/226

[56] References Cited

U.S. PATENT DOCUMENTS 5,488,326  1/1996  Shiraishi et al. ................... 327/108

*Primary Examiner*—Toan Tran
*Assistant Examiner*—Dinh Le
*Attorney, Agent, or Firm*—Nikaido Marmelstein Murray & Oram, LLP.

[57] ABSTRACT

An improved output circuit that provides an output signal having a predetermined high voltage level regardless of the voltage of a high-potential power supply is described. In one embodiment, the invention includes a first transistor and a second transistor connected in series between a high-potential power supply and a low-potential power supply, and a third transistor connected in parallel to the first transistor between the high-potential power supply and the node between the first and second transistors. The first and second transistors are n-type MOS transistors and the third transistor is a p-type MOS transistor. In another embodiment, the invention further includes a supply voltage detector for detecting a voltage of the high-potential power supply and supplying a voltage signal to the first and third transistors for selectively enabling one of the first and third transistors based on the voltage detected.

4 Claims, 4 Drawing Sheets

OUTPUT CIRCUIT OF SEMICONDUCTOR DEVICE

BACKGROUND OF THE INVENTION

1. Field of the Invention

The present invention relates generally to an output circuit of a semiconductor device and, more particularly, to an output circuit which is connected to a bus for data transfer or the like.

2. Description of the Related Art

Generally, p-type MOS transistors are used in an output circuit of a semiconductor device to output a H-level voltage signal from its output terminal connected to a data transfer bus. On the other hand, a source follower circuit comprising n-type MOS transistors is used in an output circuit which is adapted for use in a Small Computer System Interface (SCSI) device or the like that uses a large current.

FIG. 1 presents a characteristic graph representing the relationship between the output voltage VOH and the output current IOH of MOS transistors. As apparent from this graph, n-MOS transistors have a characteristic such that the output voltage does not drop sharply with respect to an increase in the output current. FIG. 2 presents a characteristic graph representing the relationship between the source-drain voltage VDS and the source-drain current IDS of MOS transistors. The graph shows that n-MOS transistors have such a characteristic so as to maintain a constant source-drain current in its operational region. It is therefore preferable to incorporate n-MOS transistors having these characteristics into an output circuit to be adapted for use in an SCSI device which uses a large current.

FIG. 3 is a circuit diagram illustrating an output circuit 10 having a source follower circuit comprising n-MOS transistors. This output circuit 10 has a pull-up n-MOS transistor 11 and a pull-down n-MOS transistor 12 connected in series between a high-potential power supply VDD and a low-potential power supply (ground) GND. The pull-up n-MOS transistor 11 and a pull-down n-MOS transistor 12 connect together at an output terminal (node) 13. The pull-up n-MOS transistor 11 has a gate for receiving an input signal IN, and the pull-down n-MOS transistor 12 has a gate for receiving an input signal /IN. One of the transistors 11 and 12 is turned on in response to the H-level voltage of the input signal IN or /IN and outputs an output signal from the output terminal 13. The output terminal 13 is connected to a bus line 14.

The output circuit 10 further includes a first terminating resistor R1 connected between the bus line 14 and the high-potential power supply VDD, and a second terminating resistor R2 connected between the bus line 14 and the ground GND. The potential difference between the high-potential power supply VDD and the ground GND is divided in accordance with the resistance ratio of the terminating resistors R1 and R2. The resulting H-level voltage at the output terminal 13 that is to be applied to the bus line 14 is thus set to a predetermined voltage. Typically, the predetermined voltage is about +3.0 volts (V). With the voltage of the power supply VDD set to +5.0 V, when the n-MOS transistor 11 having a threshold voltage Vthn of 1.5 V to 2.0 V (see FIG. 2) is turned on, an H-level output signal of about +3.5 V to +3.0 V is output from the output terminal 13.

The recent trend is that the voltage of the power supply VDD is being shifted down to +3.0 V from +5.0 V due to the demand of lower consumed power for semiconductor devices. With the supply voltage VDD set to +3.0 V, the H-level voltage on the bus line 14 is set to about +1.8 V in the output circuit 10. In this case, when the pull-up n-MOS transistor 11 is turned on under this situation, an output voltage signal of only about +1.5 V to +1.0 V is output from the output terminal 13. With this recent trend of lower power supply Vdd voltages, an output voltage signal whose level is high enough to sufficiently suppress the bouncing of the overshoot cannot be acquired from the output terminal 13. The waveform of the output signal of the output circuit 10 therefore is subjected to a large ringing as shown in FIG. 4.

SUMMARY OF THE INVENTION

Broadly speaking, the present invention relates to an output circuit which provides an output signal having a predetermined high voltage level regardless of the voltage of a high-potential power supply. The present invention can be implemented in numerous ways including as an apparatus and a method.

As an output circuit, an embodiment of the invention includes a first transistor and a second transistor connected in series between a high-potential power supply and a low-potential power supply, and a third transistor connected in parallel to the first transistor between the high-potential power supply and the node between the first and second transistors. The first and second transistors are n-type MOS transistors and the third transistor is a p-type MOS transistor.

As an output circuit according to another embodiment of the invention, the invention further includes a supply voltage detector, connected to the first and third transistors, for detecting a voltage of the high-potential power supply and supplying a voltage signal to the first and third transistors for selectively enabling one of the first and third transistors based on the voltage detected.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 5:
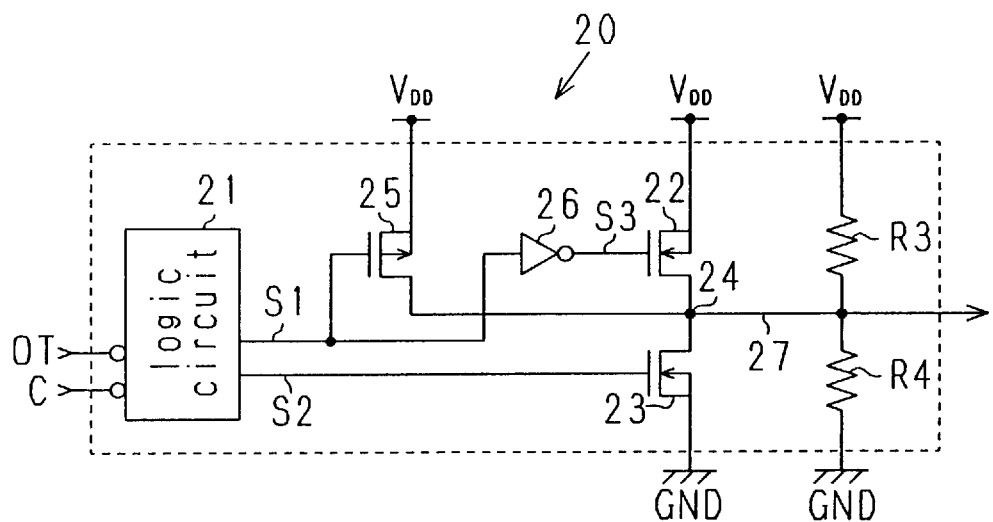
FIG. 5 is a circuit diagram illustrating an output circuit according to a first embodiment of this invention.

An output circuit for an SCSI device according to a first embodiment of this invention will now be described with reference to FIG. 5. As shown in FIG. 5, an output circuit 20 of the first embodiment includes a logic circuit 21, a pull-up n-MOS transistor 22, a pull-up p-MOS transistor 25, a pull-down n-MOS transistor 23 and a CMOS inverter 26.

The logic circuit 21 receives control signals OT and C from an external unit (not shown) and outputs signals S1 and S2 having predetermined levels based on the levels of both the control signals OT and C. More specifically, the logic circuit 21 outputs the signal S1 with a high level (H-level) and the signal S2 with a low level (L-level) in response to the control signal C having a H-level, regardless of the level of the control signal OT. Further, the logic circuit 21 outputs the signals S1 and S2 both with a high level in response to the control signal C having a L-level and the control signal OT having a H-level. Furthermore, the logic circuit 21 outputs the signals S1 and S2 both with a low level in response to the control signal C and the control signal OT both having a L-level.

The pull-up n-MOS transistor 22 and the pull-down n-MOS transistor 23 are connected in series between a high-potential power supply VDD and a low-potential power supply (ground) GND. An output terminal 24 is provided at a node connecting both the n-MOS transistors 22 and 23 together. The pull-up n-MOS transistor 22 has a gate for receiving a signal S3 which is the signal S1 whose voltage is inverted by the inverter 26. The pull-down n-MOS transistor 23 has a gate for receiving the signal S2.

The pull-up p-MOS transistor 25 is connected in parallel to the pull-up n-MOS transistor 22 between the output terminal 24 and the high-potential power supply VDD. The pull-up p-MOS transistor 25 has a gate for receiving the signal S1.

A bus line 27 is connected to the output terminal 24. A terminating resistor R3 is connected between the bus line 27 and the high-potential power supply VDD and a terminating resistor R4 is connected between the bus line 27 and the low-potential power supply (ground) GND. The potential difference between the power supply VDD and the low-potential power supply (ground) GND is divided in accordance with the resistance ratio of both the terminating resistors R3 and R4 so as to set the H-level voltage of the bus line 27 to a predetermined voltage. The resistance ratio of the terminating resistors R3 and R4 is set to 2:3 in this embodiment. For example, when the voltage of the power supply VDD is +3.0 V, the H-level voltage of the bus line 27 is set to +1.8 V. As another example, when the voltage of the power supply VDD is +5.0 V, the H-level voltage of the bus line 27 is set to +3.0 V.

When the logic circuit 21 in the output circuit 20 outputs the signals S1 and S2 both having a H-level, the pull-up p-MOS transistor 25 is turned off and the pull-down n-MOS transistor 23 is turned on. The pull-up n-MOS transistor 22 is turned off in response to the signal S3 having a L-level whose level has been inverted by the inverter 26. As a result, an output voltage signal with a L-level is output from the output terminal 24, thus rendering the bus line 27 to the L level.

Figure 1:
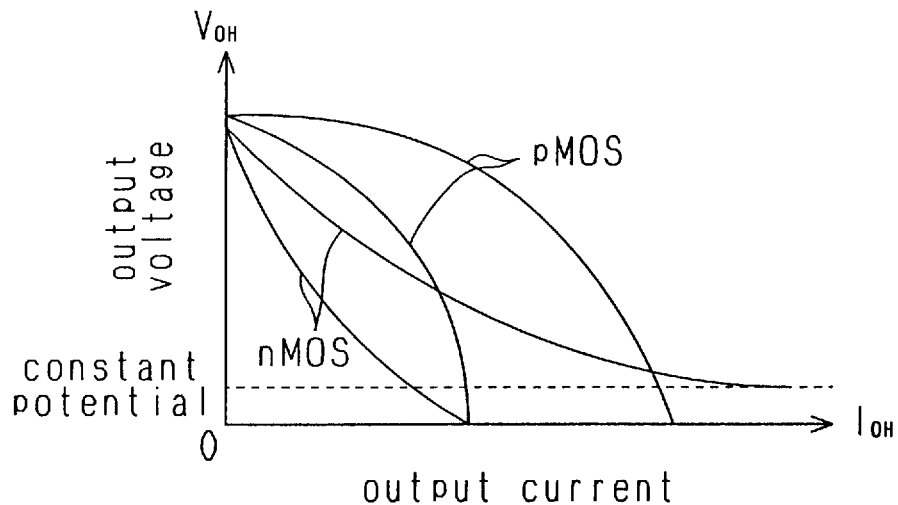
FIG. 1 is a characteristic graph representing the relationship between output voltage and output current of MOS transistors.
Figure 2:
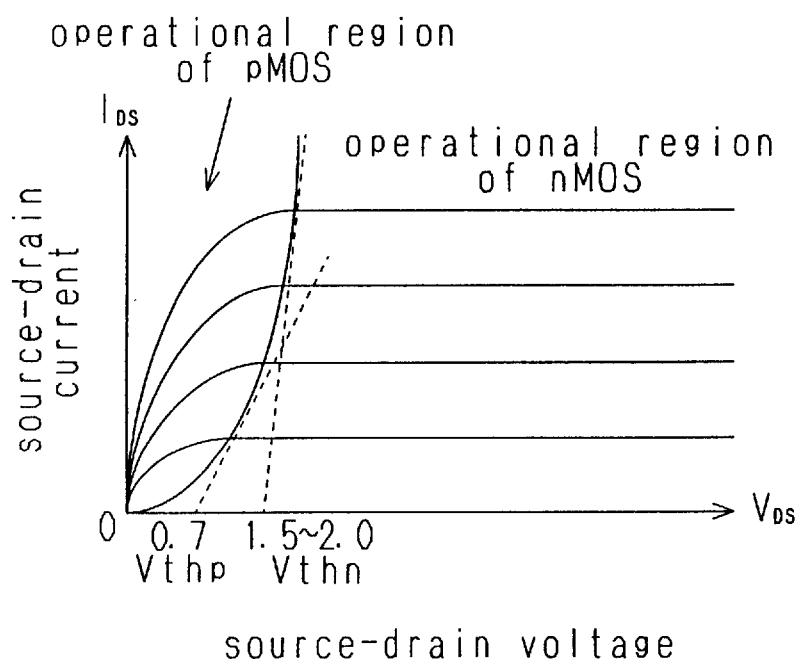
FIG. 2 is a characteristic graph representing relationship between source-drain voltage and the source-drain current of MOS transistors.
Figure 3:
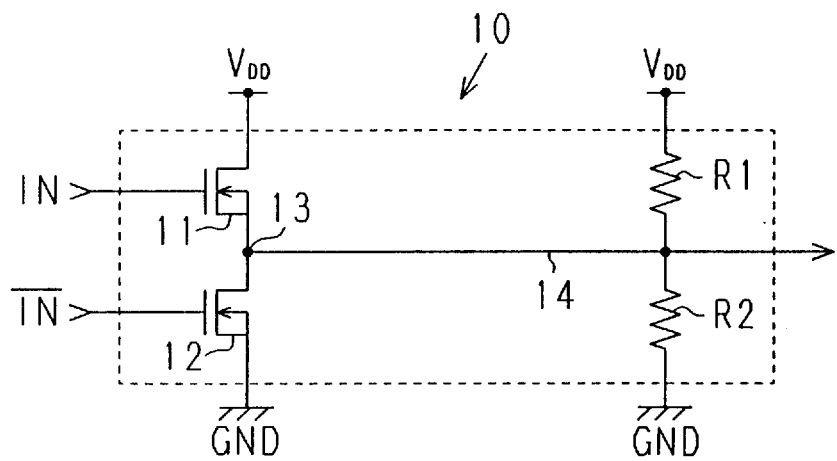
FIG. 3 is a circuit diagram showing a conventional output circuit.
Figure 4:
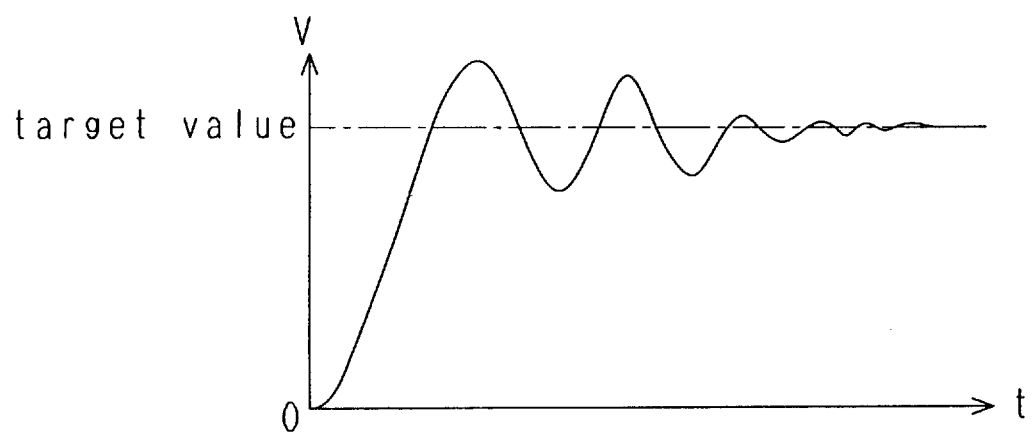
FIG. 4 is a waveform diagram of the output signal of the conventional output circuit illustrated in FIG. 3.

On the other hand, when the logic circuit 21 outputs the signals S1 and S2 both having a L-level, the pull-up p-MOS transistor 25 is turned on and the pull-down n-MOS transistor 23 is turned off. The pull-up n-MOS transistor 22 is turned on in response to the signal S3 having a H-level whose level has been inverted by the inverter 26. In the case where the voltage of the power supply VDD is +3.0 V, a H-level voltage (substantially +3 V) is supplied to the output terminal 24 by the enabled pull-up p-MOS transistor 25, so that an output voltage signal with an H-level is output from the output terminal 24. Accordingly, the bus line 27 is set to the voltage level according to the resistance ratio of the terminating resistors R3 and R4 (approximately +1.8 V in this case). If the n-MOS transistor 22 having a threshold voltage Vthn of +1.5 V to +2.0 V (see FIG. 2) alone is used, the output voltage signal merely has a voltage level of +1.5 V to +1.0 V. However, the ON action of the pull-up p-MOS transistor 25 can substantially provide an output voltage signal with a H-level of +3 V.

In another case where the voltage of the power supply VDD is +5.0 V, a H-level voltage (substantially +5 V) is acquired from the output terminal 24 because of the pull-up n-MOS transistor 22 and the pull-up p-MOS transistor 25, thus setting the bus line 27 to the voltage level according to the resistance ratio of the terminating resistors R3 and R4 (approximately +3.0 V in this case). Further, when the n-MOS transistor 22 and the pull-up p-MOS transistor 25 are turned on, an output voltage signal with a H-level of substantially +5.0 V can be acquired from the output terminal 24.

Figure 6:
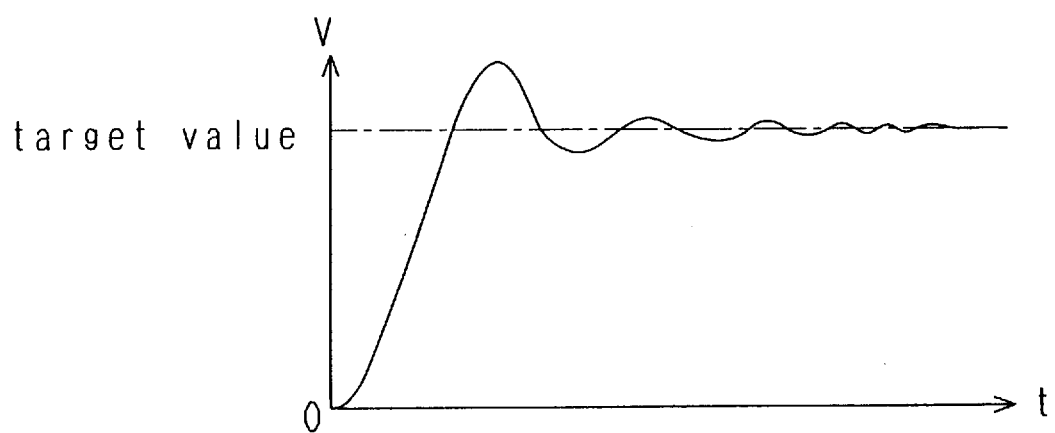
FIG. 6 is a waveform diagram of the output signal of the output circuit according to the first embodiment.

According to this embodiment, even with the supply voltage of +3 V, the output voltage signal whose level is high enough to sufficiently suppress the bouncing of the overshoot can be acquired from the output terminal 24. As shown in FIG. 6, therefore, the waveform of the output signal from the output circuit 20 indicates only minimal ringing.

The second embodiment of this invention will now be discussed with reference to FIG. 7. To avoid the redundant description, like or same reference numerals are given to those components which are the same as the corresponding components of the first embodiment.

Figure 7:
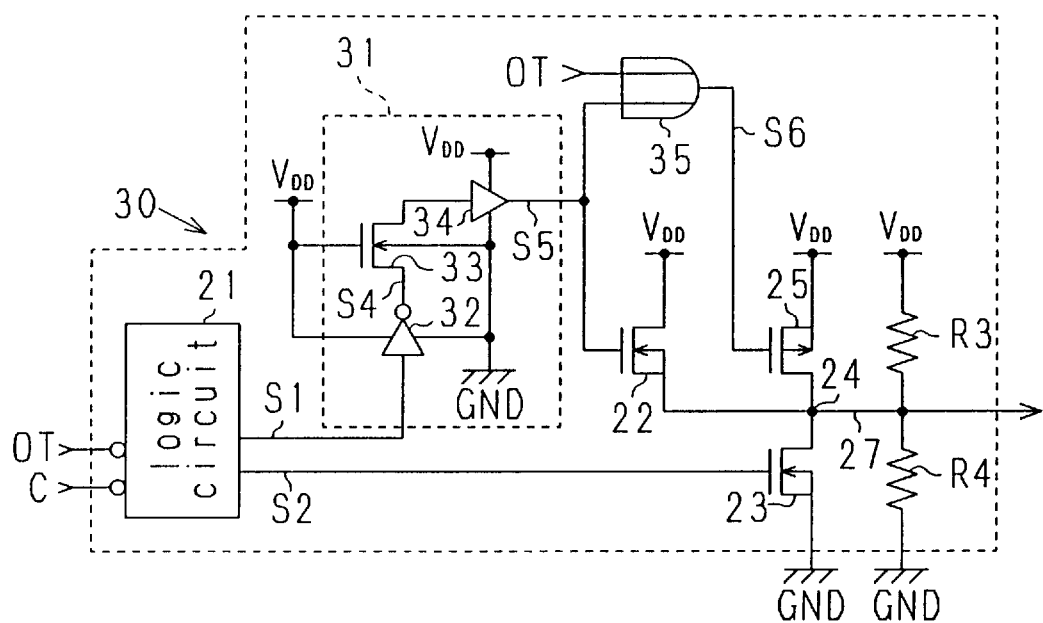
FIG. 7 is a circuit diagram illustrating an output circuit according to a second embodiment of this invention.

As shown in FIG. 7, an output circuit 30 according to the second embodiment has a voltage detector 31 and a 2-input OR gate 35 in addition to the structure of the first embodiment, including the logic circuit 21, the pull-up n-MOS transistor 22, the pull-up p-MOS transistor 25, the pull-down n-MOS transistor 23, and the terminating resistors R3 and R4.

The voltage detector 31 detects the voltage of the power supply VDD, and outputs a signal S5 to enable only either the pull-up n-MOS transistor 22 or the pull-up p-MOS transistor 25 based on the detection result. The voltage detector 31 includes a CMOS inverter 32, an n-MOS transistor 33 and a buffer 34. The CMOS inverter 32 receives the supply voltage VDD and the ground voltage GND as operational supply voltages, and outputs a signal S4 which is the signal S1 whose voltage level is inverted. The buffer 34 also receives the supply voltage VDD and the ground voltage GND as operational supply voltages. The buffer 34 operates to amplify the input signal and supply the amplified signal S5 to the pull-up n-MOS transistor 22 and the OR gate 35.

The n-MOS transistor 33, which serves as a source follower circuit, has a drain connected to the output terminal of the CMOS inverter 32, a source connected to the input terminal of the buffer 34, a gate connected to the power supply VDD, and a back gate connected to the ground voltage GND. The n-MOS transistor 33 is therefore normally enabled. Because of its back gate connected to the ground voltage GND, the n-MOS transistor 33 has a threshold voltage Vth higher than the normal one. The increased amount of the threshold voltage is DVth=1/(2×VBS).

When the supply voltage VDD is +5.0 V and the back gate of the n-MOS transistor 33 is connected to the source of the n-MOS transistor 33, for example, a voltage signal having a voltage of +3.5 V to +3.0 V is output from the source of the n-MOS transistor 33 having a threshold voltage Vth of +1.5

V to +2.0 V. Since the back gate of the n-MOS transistor 33 is connected to the ground voltage GND in this embodiment, the increased amount of the threshold voltage DVth=1/(2× 3.5) V to 1/(2×3.0) V=+0.94 V to +0.87 V should be taken into consideration. Accordingly, a voltage signal of 5.0 V−Vth =5.0 V−(1.5+0.94) V to 5.0 V−(2.0+0.84) V=+2.56 V to +2.23 V is output from the source of the n-MOS transistor 33.

When the supply voltage VDD is +3.0 V and the back gate of the n-MOS transistor 33 is connected to the source of the n-MOS transistor 33, a voltage signal of +1.5 V to +1.0 V is output from the source of the n-MOS transistor 33. The increased amount of the threshold voltage DVth=1/(2×1.5) V to 1/(2×1.0) V=+0.61 V to +0.50 V is considered in this embodiment. Therefore, a voltage signal of 3.0 V−Vth=3.0 V −(1.5+0.61) V to 3.0 V−(2.0+0.50) V=+0.89 V to +0.50 V is output from the source of the n-MOS transistor 33.

The OR gate 35 receives the control signal OT and the amplified signal S5 supplied from the buffer 34, and outputs a signal S6 to turn on or off the pull-up p-MOS transistor 25 based on both signals OT and S5.

In the output circuit 30, the logic circuit 21 outputs the signals S1 and S2 with a H-level in response to the control signal C with a L-level and the control signal OT with a H-level.

Consequently, the pull-down n-MOS transistor 23 is turned on in response to the signal S2 having a H-level. The inverter 32 inverts the signal S1 with a H-level and applies the signal S4 having an L level (GND level) to the drain of the n-MOS transistor 33. The source of the n-MOS transistor 33 is therefore set to the L-level and the buffer 34 outputs the signal S5 with a L-level. As a result, the pull-up n-MOS transistor 22 is turned off in response to the output signal S5 having the L-level. The OR gate 35 supplies the output signal S6 having the H-level to the pull-up p-MOS transistor 25 in response to the control signal OT having the H-level and the output signal S5 having the L-level. The transistor 25 is turned off in response to the output signal S6 having the H-level. Then, the output voltage signal with the L-level is sent out from the output terminal 24, setting the bus line 27 to the L-level.

The logic circuit 21 outputs the signals S1 and S2 both of an L level in response to the control signal C having the L-level and the control signal OT having the L-level. Then, the pull-down n-MOS transistor 23 is turned off in response to the signal S2 having the L-level. The inverter 32 inverts the signal S1 with the L-level and applies the signal S4 of the H-level (the level of the power supply VDD) to the drain of the n-MOS transistor 33.

When the supply voltage VDD is +5.0 V, a voltage signal of +2.56 V to +2.23 V is output from the source of the n-MOS transistor 33. The buffer 34 amplifies that voltage signal and outputs the output signal S5 having the H-level. The nMOS transistor 22 is thus turned on in response to the output signal S5 having the H-level.

The OR gate 35 supplies the output signal S6 having the H-level to the pull-up p-MOS transistor 25 in response to the control signal OT having the L-level and the output signal S5 having the H-level. The transistor 25 is turned off in response to the output signal S6 having the H-level. Accordingly, a voltage signal of +3.5 V to +3.0 V is supplied to the output terminal 24 via the pull-up n-MOS transistor 22. As a result, the output voltage signal having the H-level is output from the output terminal 24, setting the bus line 27 to the voltage level according to the resistance ratio of the terminating resistors R3 and R4 (about +3.0 V in this case).

When the supply voltage VDD is +3.0 V, a voltage signal of +0.89 V to +0.50 V is output from the source of the n-MOS transistor 33. This voltage signal is not amplified by the buffer 34, and the buffer 34 supplies the output signal S5 having the L-level (GND level) to the pull-up n-MOS transistor 22. The n-MOS transistor 22 is thus turned off in response to the output signal S5.

The OR gate 35 supplies the output signal S6 having the L-level to the pull-up p-MOS transistor 25, which is then turned on. Therefore, a voltage signal of substantially +3.0 V is supplied to the output terminal 24 via the pull-up p-MOS transistor 25. As a result, the output voltage signal having the H-level is output from the output terminal 24, causing the bus line 27 to be set to the voltage level according to the resistance ratio of the terminating resistors R3 and R4 (approximately +1.8 V in this case).

In the second embodiment, when the supply voltage VDD is +5.0 V, the output voltage signal having a predetermined H-level (+3.5 V to +3.0 V) is output from the output terminal 24 by the ON action of only the pull-up n-MOS transistor 22. That is, if an output voltage signal having a predetermined H level can be obtained from the output terminal 24 by the ON action of the pull-up n-MOS transistor 22, the pull-up p-MOS transistor 25 is turned off.

When the supply voltage VDD is +3.0 V, the output voltage signal having a predetermined H-level (substantially +3.0 V) is output from the output terminal 24 by the ON action of only the pull-up p-MOS transistor 25. In other words, if an output voltage signal having a predetermined H-level cannot be acquired from the output terminal 24 by the ON action of the pull-up n-MOS transistor 22, the transistor 22 is turned off and the pull-up p-MOS transistor 25 is turned on instead. The selective ON/OFF control of those transistors contributes to reducing the consumed power of the output circuit 30.

Although only two embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. An output circuit comprising:
    a first transistor and a second transistor connected in series between a high-potential power supply and a low-potential power supply wherein said second transistor receiving an input signal at an input node;
    a third transistor connected in parallel to said first transistor between said high-potential power supply and an output node between said first and second transistors,
    wherein said first and second transistors are n-type MOS transistors and said third transistor is a p-type MOS transistor; and
    a supply voltage detector connected to said high-potential power supply and to said first and third transistors, for detecting a voltage of said high-potential power supply and supplying a voltage signal to said first and third transistors for enabling one of said first and third transistors based on the detected voltage.

2. The output circuit according to claim 1, wherein both of said first and third transistors are turned on in order to output an output voltage signal having a predetermined high-level output voltage from said output node.

3. The output circuit according to claim 1, wherein one of said first and third transistors is turned on in order to output an output voltage signal having a predetermined high-level output voltage from said output node.

4. The output circuit according to claim 1, wherein said supply voltage detector includes:

an n-type MOS transistor having a first terminal for receiving a signal of substantially the same voltage as the voltage of said high-potential power supply, a control terminal connected to said high-potential power supply, a second terminal, and a back gate connected to said low-potential power supply; and a buffer having an input terminal, connected to the second terminal for outputting said voltage signal for enabling one of said first and third transistors.

* * * * *